US008012772B2

(12) United States Patent
Koide et al.

(10) Patent No.: US 8,012,772 B2
(45) Date of Patent: Sep. 6, 2011

(54) SUBSTRATE TREATING APPARATUS, SUBSTRATE TREATING METHOD, AND METHOD FOR MANUFACTURING HIGH-VOLTAGE DEVICE

(75) Inventors: Satoshi Koide, Fukaya (JP); Yasushi Iseki, Yokohama (JP); Akira Ishii, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 442 days.

(21) Appl. No.: 12/343,642

(22) Filed: Dec. 24, 2008

(65) Prior Publication Data

US 2009/0163107 A1 Jun. 25, 2009

(30) Foreign Application Priority Data

Dec. 25, 2007 (JP) ................................ 2007-332116

(51) Int. Cl.

| | |
|---|---|
| ***H01L 21/00*** | (2006.01) |
| ***C23F 1/02*** | (2006.01) |
| ***H01J 9/00*** | (2006.01) |
| ***H01J 9/44*** | (2006.01) |

(52) U.S. Cl. ............... 438/13; 257/E21.485; 156/345.1; 445/5

(58) Field of Classification Search .................... 438/10, 438/12, 13; 257/E21.485; 445/5; 156/345.1
See application file for complete search history.

(56) References Cited

U.S. PATENT DOCUMENTS

2011/0094679 A1* 4/2011 Dong et al. ................ 156/345.1

FOREIGN PATENT DOCUMENTS

JP 2003-303545 10/2003

* cited by examiner

*Primary Examiner* — David S Blum

(74) *Attorney, Agent, or Firm* — Fitzpatrick, Cella, Harper & Scinto

(57) ABSTRACT

A substrate treating apparatus, in which a voltage is applied to between a treatment electrode and a target substrate in such a state that the treatment electrode is opposed to the target substrate to thereby perform substrate treatment for removing undesired substances on the target substrate, has a reference electrode, a transfer unit which transfers at least one of the treatment electrode and the reference electrode to thereby provide the treatment electrode so that the treatment electrode is opposed to the reference electrode, and a check unit for applying a voltage to between the treatment electrode and the reference electrode in such a state that the treatment electrode is opposed to the reference electrode and thereby checking an adhesion level of undesired substances onto the treatment electrode surface.

3 Claims, 7 Drawing Sheets

SUBSTRATE TREATING APPARATUS, SUBSTRATE TREATING METHOD, AND METHOD FOR MANUFACTURING HIGH-VOLTAGE DEVICE

BACKGROUND OF THE INVENTION

1. Field of the Invention

The present invention relates to a substrate treating apparatus, which treats a substrate constituting an image display apparatus, and a substrate treating method. The present invention further relates to a method for manufacturing a high-voltage device.

2. Description of the Related Art

Recently, various types of flat type image display apparatuses have attracted attention as a next-generation light and thin image display apparatus to replace a cathode-ray tube (hereinafter referred to as a CRT). For example, there has been known a plasma display (PDP) using luminescence of a phosphor due to a discharge phenomenon, a liquid crystal display (LCD), and a display using an electron-emitting device such as a filed emission device and a surface-conduction electron-emitting device.

In general, the display using the electron-emitting device uses a rear plate with the electron-emitting device disposed thereon and a face plate with a phosphor layer. When an image is displayed, an anode voltage is applied to the phosphor layer. An electron beam emitted from the electron-emitting device is accelerated by the anode voltage to be collided with the phosphor layer, whereby the phosphor layer emits light to display the image. In order to obtain practical display properties, it is necessary to use a phosphor similar to a normal CRT, and to set the anode voltage to several kV or higher, preferably to 5 kV or higher.

As described above, when a high voltage is applied as the anode voltage, the formation of an intense electric field in a small gap between the face plate and the rear plate cannot be avoided, and therefore, discharge between the both plates (breakdown) becomes a problem. If the discharge occurs, an electric current of 100 A or higher may momentarily flow, whereby an electron-emitting device, a phosphor surface, and a drive circuit may be destructed or deteriorated. The damage due to such a discharge is causative of a fatal defect of products, and thus, a measure for preventing the occurrence of discharge for a long period of time is required. Here, a voltage which can be applied without the occurrence of discharge is called a “withstand voltage”.

As a method for preventing the discharge, there has been known a treating method (hereinafter called a “withstand voltage treatment”) which realizes the improvement of the withstand voltage by the removal of undesired substances remaining on a face plate and a rear plate. For example, in a withstand voltage treating method for a substrate disclosed in Japanese Patent Application Laid-Open No. 2003-303545, a substrate and a treatment electrode are disposed so as to be opposed to each other in a vacuum atmosphere, and an electric field is applied to between the substrate and the treatment electrode to thereby apply the electric field treatment to the substrate. According to this method, undesired substances and protrusions remaining on the substrate are absorbed to the treatment electrode to be then removed, and the factor of the occurrence of discharge can be removed. The image display apparatus is constituted by using this substrate, whereby it is possible to realize the improvement of the withstand voltage property.

In the above withstand voltage treatment, when undesired substances are previously adhered onto the surface of a treatment electrode, or when undesired substances removed from a substrate are deposited on the treatment electrode due to the repetition of the withstand voltage treatment, leading to the reduction of the effect of the withstand voltage treatment, and the withstand voltage required for the substrate cannot be ensured. The reduction of the treatment effect is partly due to the returning of the undesired substances, adhered onto the treatment electrode surface, to the target substrate. Another factor is the reduction of a treatment electric field due to a field emission current generated from the undesired substances adhered to the treatment electrode. For example, when a glass with a volume resistance of $10^{10}$ Ω·cm and a thickness of 0.1 cm is used as a dielectric body, if the field emission current of 1 nA with a beam cross section of $10^{-6}$ cm$^2$ is emitted from undesired substances adhered onto the surface of the dielectric body, the voltage drop of 10 kV-order occurs in the glass by estimate. According to approximate calculation performed by us, the voltage drop in a glass becomes a problem in a range from 10 nA to 1 μA. The voltage drop in the dielectric body is causative of the reduction of the surface potential in the target substrate at a position opposed to the adhered undesired substances, whereby the treatment effect is reduced.

There is another problem in the withstand voltage treatment in that, when there is a region with a small adhesion force (easily to be fallen and peeled) in a part of the target substrate due to factors in the manufacturing process, even if the target substrate has a poor withstand voltage, the withstand voltage treatment is continued. If the defect in such a substrate cannot be detected, the substrate proceeds to the following process (assembly process and the like) and therefore to lead to a reduction in panel production rate. In addition, if the target substrate has a region with a small adhesion force, a large number of fallen undesired substances are deposited on the treatment electrode to lead to increasing of the frequency of maintenance (replacement or surface cleaning) for the treatment electrode. Thus, it is necessary to immediately stop the withstand voltage treatment to the target substrate which has on its surface a region with a small adhesion force, and the substrate is required to be treated as a defective.

SUMMARY OF THE INVENTION

An object of the present invention is to provide a technique for accurately detecting adhesion and deposition of undesired substances onto a treatment electrode in order to perform a normal withstand voltage treatment.

In order to achieve the above object, the present invention adopts the following constitutions.

In the first invention, a substrate treating apparatus, which applies a voltage to between a treatment electrode and a target substrate in such a state that the treatment electrode is opposed to the target substrate and thereby performs substrate treatment for removing an undesired substance on the target substrate, has a reference electrode; a transfer unit which transfers at least one of the treatment electrode and the reference electrode to thereby provide the treatment electrode so as to be opposed to the reference electrode; and a check unit which applies a voltage to between the treatment electrode and the reference electrode in such a state that the treatment electrode is opposed to the reference electrode and thereby checks an adhesion level of an undesired substance onto a surface of the treatment electrode.

In the second invention, a substrate treating method has a substrate treatment step of applying a voltage to between a treatment electrode and a target substrate in such a state that the treatment electrode is opposed to the target substrate and thereby removing an undesired substance on the target substrate; a transfer step of transferring at least one of the treatment electrode and a reference electrode before or after the substrate treatment step and thereby providing the treatment electrode so as to be opposed to the reference electrode; and a check step of applying a voltage to between the treatment electrode and the reference electrode in such a state that the treatment electrode is opposed to the reference electrode and thereby checking an adhesion level of an undesired substance onto a surface of the treatment electrode.

In the third invention, a method for manufacturing a high-voltage device has a substrate treatment step of applying a voltage to between a treatment electrode and a substrate constituting the high-voltage device in such a state that the substrate is opposed to the treatment electrode and thereby removing an undesired substance on the substrate; and an assembly step of assembling the high-voltage device using the substrate after the substrate treatment step. The treatment electrode used in the substrate treatment step is a treatment electrode in which a voltage is applied between the treatment electrode and a reference electrode in such a state that the treatment electrode is opposed to the reference electrode to thereby check an adhesion level of an undesired substance onto a surface of the treatment electrode.

According to the present invention, the adhesion and deposition of the undesired substances onto the treatment electrode can be accurately detected and thereby a normal withstand voltage treatment can be performed.

Further features of the present invention will become apparent from the following description of exemplary embodiments with reference to the attached drawings.

DESCRIPTION OF THE EMBODIMENTS

Hereinafter, the preferred embodiments of this invention are exemplarily described in detail with reference to the drawings.

A substrate treating method and a substrate treating apparatus of the present invention are used for applying a withstand voltage treatment to a face plate or a rear plate of an image display apparatus. An image display apparatus using an electron-emitting device is preferably used. As the electron-emitting device, a field emission device, a surface-conduction electron-emitting device, and an MIM type device can be used. An image display apparatus having the surface-conduction electron-emitting device is described as an example in the following embodiments.

Constitution of Image Display Apparatus

Figure 1:
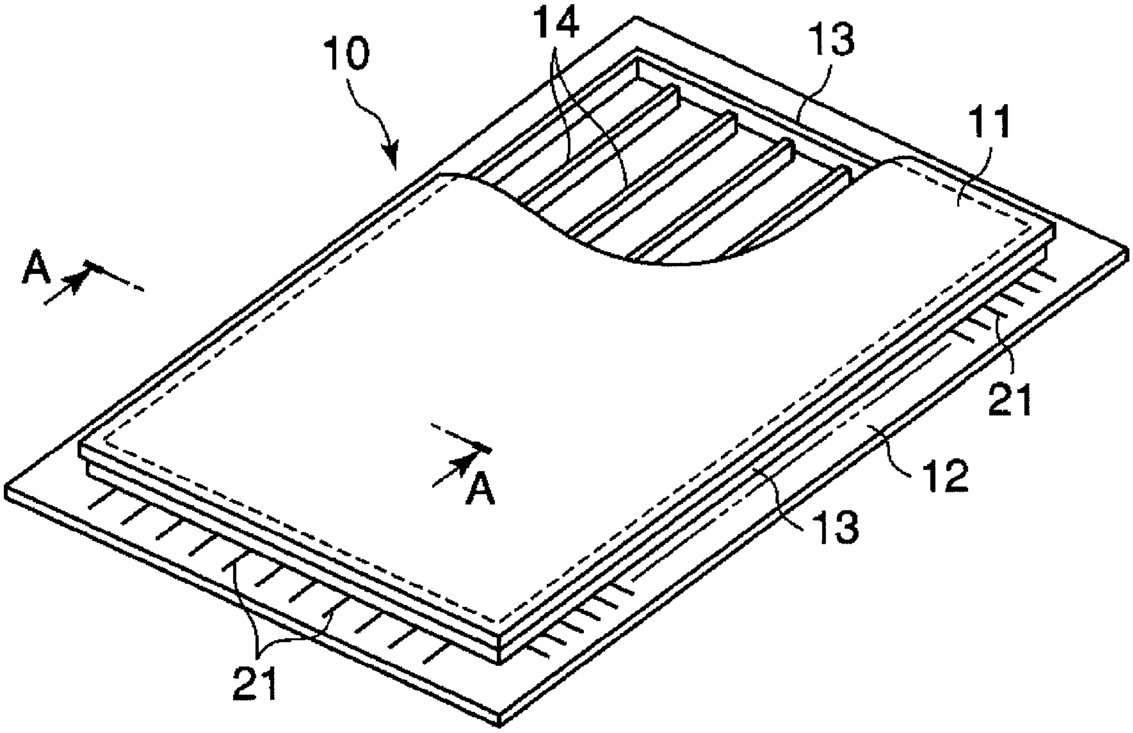
FIG. 1 is a perspective view of a display panel of an image display apparatus.
Figure 2:
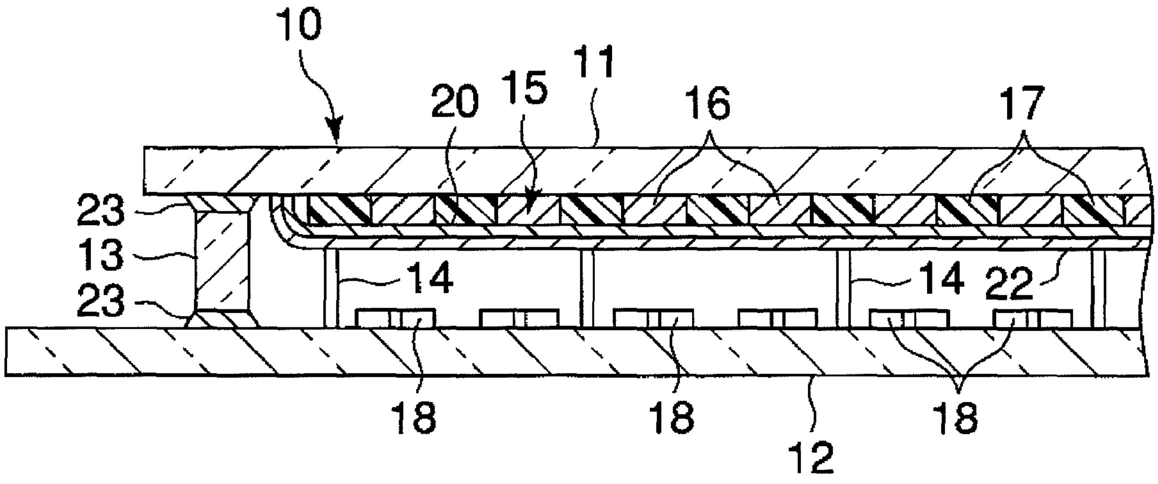
FIG. 2 is a cross-sectional view of the display panel taken by a line A-A shown in FIG. 1.

FIGS. 1 and 2 show an image display apparatus having a surface-conduction electron-emitting device. FIG. 1 is a perspective view of a display panel of the image display apparatus. FIG. 2 is a cross-sectional view of the display panel.

As shown in FIGS. 1 and 2, a display panel has a face plate 11 and a rear plate 12 formed of a rectangular shaped glass plate. These plates are arranged to be opposed to each other at an interval of about 1.0 to 2.0 mm. The face plate 11 and rear plate 12 are joined together through a rectangular frame-shaped side wall 13 formed of glass. According to this constitution, a flat vacuum envelope 10 in which a high vacuum of about $10^{-5}$ Pa is maintained is constituted.

The side wall 13 is sealed at the peripheral edge of the face plate 11 and the peripheral edge of the rear plate 12 through a sealing material 23 such as a low melting point glass or a low melting point metal.

In order to support an atmospheric pressure load applied to the face plate 11 and the rear plate 12, the vacuum envelope 10 includes, for example, a plurality of plate-like support members (spacers) 14 formed of glass. These support members 14 extend in a direction parallel to the long side of the vacuum envelope 10, and, at the same time, are arranged along a direction parallel to the short side at a predetermined interval. The shape of the support member 14 is not limited thereto, and columnar support members may be used.

The face plate 11 has on its inner surface a phosphor screen 15 functioning as a phosphor surface. The phosphor screen 15 is constituted so that phosphor layers 16 emitting red, green, and blue light and light-shielding layers 17 are arranged. These phosphor layers 16 are in a stripe form, a dot form, or a rectangular form. A metal back 20 formed of aluminum or the like and a getter film 22 are sequentially formed on the phosphor screen 15.

The rear plate 12 has on its inner surface a large number of surface-conduction electron-emitting devices 18 which are electron emission sources for exciting the phosphor layer 16 of the phosphor screen 15 and emit an electron beam. These electron-emitting devices 18 are arranged in a plurality of columns and rows and form a pixel with the corresponding phosphor layer. Each of the electron-emitting devices 18 is constituted of an electron-emitting portion (not shown), a pair of device electrodes for applying a voltage to the electron-emitting portion, and so on. A large number of wirings 21 for supplying an electrical potential to the electron-emitting devices 18 are provided in a matrix on the inner surface of the rear plate 12, and the ends of the wirings 21 are drawn outside the vacuum envelope 10.

When an image is displayed, an anode voltage of 8 kV, for example, is applied to the phosphor screen 15 and the metal back 20. The electron beam emitted from the electron-emitting device 18 is accelerated by the anode voltage to be collided with the phosphor screen 15. According to this constitution, the phosphor layer 16 of the phosphor screen 15 is excited to emit light, and, thus, to display a color image.

Substrate Treating Apparatus of First Embodiment

Figure 3:
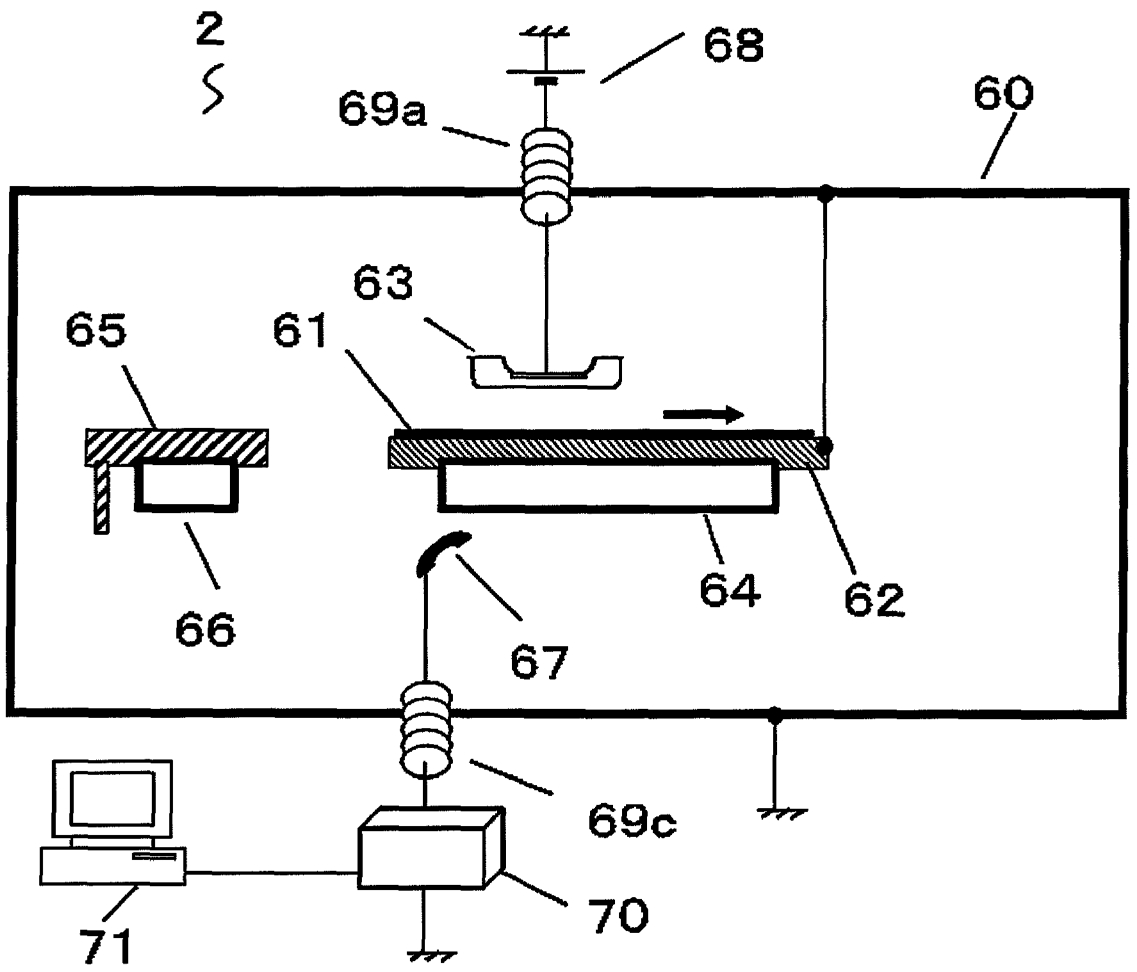
FIG. 3 is a view showing a structural example of a substrate treating apparatus according to a first embodiment.

The first embodiment of this invention is described. FIG. 3 is a view showing a structural example of a substrate treating apparatus 2 according to the first embodiment. In FIG. 3, the substrate treating apparatus 2 has a vacuum treatment bath (vacuum chamber) 60. The vacuum treatment bath 60 includes a rectangular plate-like substrate holding part (substrate holding unit) 62 on which a substrate (target substrate) 61, which is a target to be treated, that is, a target to be monitored, is placed. The vacuum treatment bath 60 further includes a rectangular plate-like treatment electrode 63 provided so as to be opposed to the substrate holding part 62. The plane area of the treatment electrode 63 is smaller than the plane area of the substrate 61. In the present embodiment, for example, the width of the treatment electrode 63 (dimension in the direction vertical to the drawing in FIG. 3) is somewhat larger than the width of the substrate 61, and the length of the treatment electrode 63 (dimension in the left and right directions in FIG. 3) is about one-tenth of the length of the substrate 61. The treatment electrode 63 is formed of, for example, a glass plate with ITO coated on the surface. The treatment electrode 63 is disposed so that the glass surface as a dielectric body is directed toward the substrate 61. The substrate treating apparatus 2 has a first drive unit 64 for transferring the substrate 61 and the substrate holding part 62 in parallel relative to the treatment electrode 63.

Further, the vacuum treatment bath 60 includes a third electrode 65 (hereinafter referred to as a reference electrode 65) having an electroconductivity. The reference electrode 65 is held by a second drive unit 66 (transfer unit) through an insulator (not shown). The reference electrode 65 is formed of, for example, SUS, and the size is substantially the same as the size of the treatment electrode 63. The reference electrode 65 has a clean (namely, undesired substances are less adhered) surface and is used in the check treatment of the treatment electrode 63 described later. The second drive unit 66 can transfer the reference electrode 65 to a position (hereinafter referred to as a check position) opposed to the treatment electrode 63. The reference electrode 65 is electrically connected to a lead 67 in the check position. The lead 67 is not in contact with the substrate 61 and the substrate holding part 62, but can be connected to only the reference electrode 65.

The substrate treating apparatus 2 has a high-voltage supply 68. The high-voltage supply 68 is electrically connected to the treatment electrode 63 via a feed-through 69*a* attached to the vacuum treatment bath 60. A voltage is supplied from the high-voltage supply 68 to the treatment electrode 63. The substrate 61 is electrically connected to the vacuum treatment bath 60 via the substrate holding part 62, and the vacuum treatment bath 60 is electrically grounded. The lead 67 is drawn outside the vacuum treatment bath 60 via a feed-through 69*c* attached to the vacuum treatment bath 60 and electrically connected to a ground part via a minute ammeter 70 outside the vacuum treatment bath 60. As the minute ammeter 70, an ammeter having sensitivity with an electric current of 1 μA or less can be preferably used. A personal computer 71 for control and data processing is connected to a data output terminal of the minute ammeter 70 through a signal line. In the present embodiment, the personal computer 71 and the minute ammeter 70 constitute check unit for checking the adhesion level of undesired substances onto the treatment electrode surface.

(Withstand Voltage Treatment for Substrate)

Next, a substrate treating method using the above substrate treating apparatus is described.

First, the substrate 61 to be treated is placed on the substrate holding part 62 by, for example, electrically chucking. Thereafter, an exhaust device (not shown) evacuates the inside of the vacuum treatment bath 60 to a vacuum degree of about $10^{-5}$ Torr to set in a vacuum atmosphere. Subsequently, a voltage of not less than a panel rating is applied to the treatment electrode 63 by the high-voltage supply 68. The substrate 61 is transferred in the arrow direction in FIG. 3 by the first drive unit 64, while keeping the electric potential state. The entire surface of the substrate 61 is scanned by the treatment electrode 63 to thereby be subjected to the withstand voltage treatment (substrate treatment). Namely, a high voltage (high electric field) is applied to between the treatment electrode 63 and the substrate 61 in such a state that the treatment electrode 63 is opposed to the substrate 61, whereby the undesired substances (such as fine particles) adhered onto the substrate 61 are peeled from the substrate 61 to be captured by the treatment electrode 63. According to this action, the undesired substances adhered on the substrate 61 which are causative of discharge are removed from the substrate 61, and thus, the withstand voltage of the substrate is improved.

(Check Treatment of Treatment Electrode)

The undesired substances removed from the substrate 61 are deposited on the surface (glass face) of the treatment electrode 63 due to the repetition of the above withstand voltage treatment, leading to the reduction of the effect of the withstand voltage treatment. In rare cases, undesired substances are primitively adhered to the treatment electrode 63, whereby an intended withstand voltage treatment effect may not be obtained. Therefore, replacement or cleaning of the treatment electrode 63 is required according to need; however, the prior art does not have means for accurately grasping the adhesion level of undesired substances onto the treatment electrode surface (the amount of the undesired substances adhered onto the treatment electrode surface), and therefore, the proper time for replacement (cleaning) of the treatment electrode 63 is difficult to be determined. Thus, in the present embodiment, the adhesion level of the undesired substances onto the surface of the treatment electrode 63 is checked by the following method.

Figure 4:
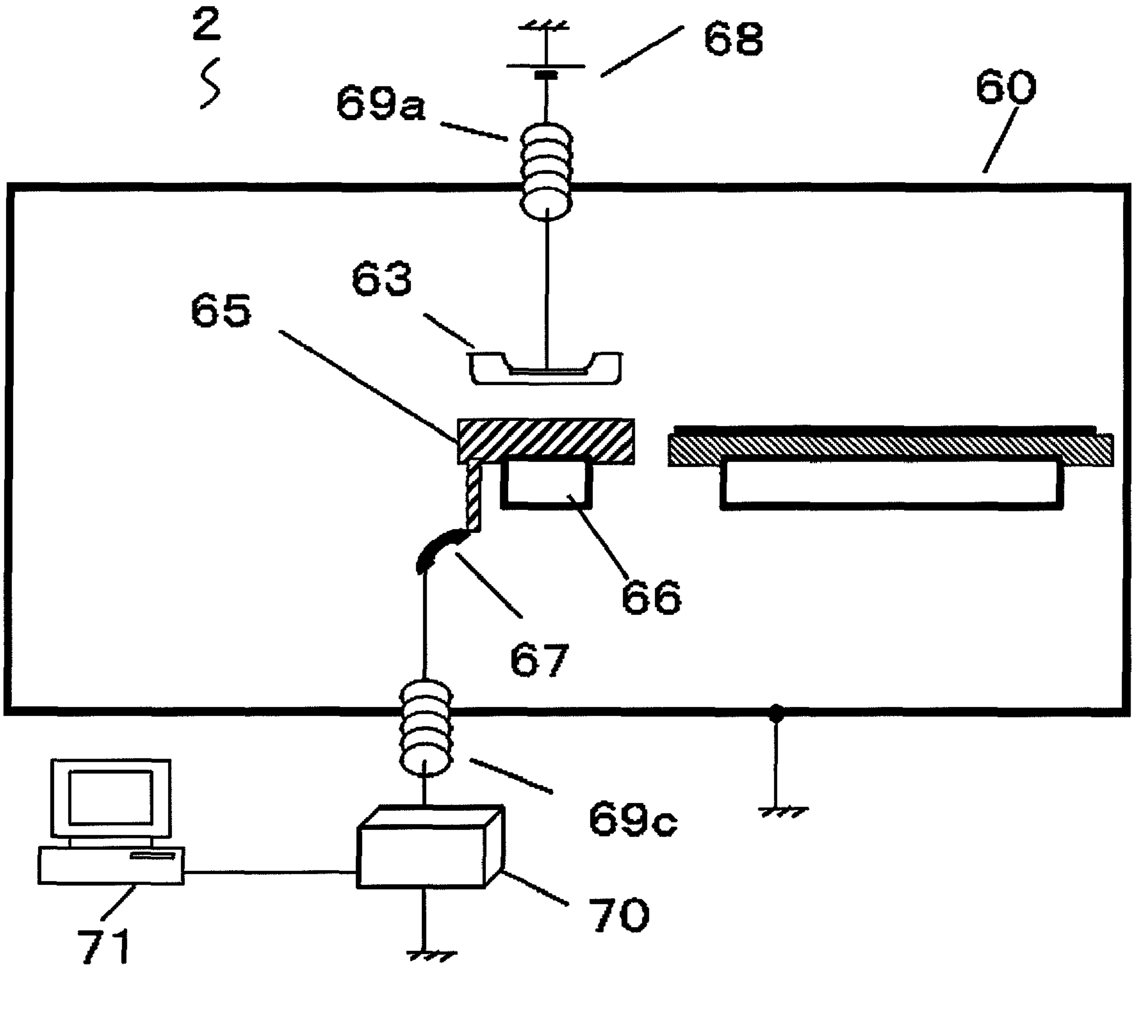
FIG. 4 is a view showing a check treatment for a treatment electrode in the first embodiment.

FIG. 4 is a view showing the check treatment of the treatment electrode 63.

After the withstand voltage treatment for the substrate 61 is finished, the first drive unit 64 retracts the substrate 61 from the treatment electrode 63. The second drive unit 66 then transfers the reference electrode 65 to the check position so that the reference electrode 65 is opposed to the treatment electrode 63. At this time, the reference electrode 65 is disposed parallel to the treatment electrode 63. The interval between the reference electrode 65 and the treatment electrode 63 in the check treatment is set to be substantially the same as the interval between the substrate 61 and the treatment electrode 63 in the withstand voltage treatment. The reference electrode 65 in the check position is electrically connected to the lead 67.

In the state of FIG. 4, a high voltage is applied from the high-voltage supply 68 to the treatment electrode 63. The surface of the reference electrode 65 is clean, and therefore, when the surface of the treatment electrode 63 is also clean, less electric current is observed by the minute ammeter 70. Meanwhile, when undesired substances are deposited on the surface of the treatment electrode 63, a field emission current is generated from the undesired substances, and therefore, an electric current, which is significantly larger than the electric current in the case in which the treatment electrode surface is clean, is observed. In a typical case, a DC component of a measurement value of the minute ammeter 70 is increased (see, FIG. 7C). As described above, in the present embodiment, the check treatment is performed by using the reference electrode having a clean surface, and therefore, the increasing of the electric current due to the deposition of undesired substances on the treatment electrode surface can be detected with high accuracy, whereby the adhesion level of the undesired substances onto the treatment electrode 63 can be accurately determined.

A current value (measurement value) of the treatment electrode 63 in the check treatment is displayed as a graph on the screen of the personal computer 71. When the current value exceeds a predetermined threshold value, a voltage application signal is transmitted from the personal computer 71 to the high-voltage supply 68 to stop the supply of high voltage from the high-voltage supply 68. When a state control panel (not shown) for controlling the supply of high voltage from the high-voltage supply is used as an external equipment, an interlock signal is transmitted from the personal computer 71 to the state control panel to stop the supply of high voltage. In addition, when the current value exceeds a predetermined threshold value, a display showing an abnormality (alarm display) is output to the screen of the personal computer 71. When a warning device such as a state indicator light is used as an external equipment, an alarm signal is transmitted from the personal computer 71 to the warning device to operate the warning device, and, thus, to notify an operator of the necessity to replace or clean the treatment electrode 63. The withstand voltage treatment for the next substrate is then stopped, and the treatment electrode 63 is replaced or cleaned.

When it is determined that the undesired substances are not required to be removed from the treatment electrode 63 due to the result of the check by the reference electrode 65, the treatment electrode 63 is not cleaned. The next target substrate is set in the substrate holding part 62 in the vacuum chamber 60, and the treatment electrode 63 applies a voltage to the next target substrate.

As described above, the state of the treatment electrode surface can be properly monitored. Therefore, the treatment electrode can be subjected to maintenance (can be replaced or cleaned on its surface) immediately after the occurrence of a state requiring maintenance due to the adhesion of undesired substances onto the treatment electrode 63, whereby it is possible to realize the improvement of the effect of the withstand voltage treatment and the improvement of the yield of products.

In this embodiment, as shown in FIGS. 3 and 4, a high voltage is applied to the treatment electrode 63 in the withstand voltage treatment and in the check of the treatment electrode 63. Therefore, the withstand voltage treatment can be applied to the substrate 61 while maintaining the substrate 61 to a ground potential. In addition, the substrate 61 is not required to be maintained in an electrically insulated state with respect to the substrate holding part 62 and the vacuum treatment bath 60. Further, the substrate 61 can be electrically connected directly to the vacuum treatment bath 60. According to this constitution, the structure can be substantially simplified and reduced in size.

However, when the structure may be complicated and increased in size, the treatment electrode 63 is set to a ground potential, and a high voltage may be applied to the substrate 61 and the reference electrode 65. In such a constitution, a minute ammeter is provided in an electrical circuit loop constituted of a high-voltage supply, a reference electrode, a treatment electrode, and a vacuum treatment bath (ground part), whereby the treatment electrode can be monitored.

The electric current between the treatment electrode 63 and the reference electrode 65 can be detected even if the minute ammeter is provided at any position of the circuit loop. However, the minute ammeter is preferably provided between the treatment electrode 63 or the reference electrode 65 provided on the ground potential side and the ground part (vacuum treatment bath). When the minute ammeter is provided on the high-voltage supply side, a high voltage is input to an input part of the ammeter. In this case, the minute ammeter is required to be set to a floating potential for the periphery, or is required to undergo electrical shielding or the like. When the minute ammeter is attached on the ground part side with respect to the treatment electrode 63 and the reference electrode 65, these measures are not required, whereby the apparatus constitution becomes simple.

In the constitution of this embodiment, although the reference electrode 65 attached to the second drive unit 66 is transferred in the direction parallel to the treatment electrode 63, but not limited to this constitution. For example, the reference electrode 65 may be transferred in the vertical direction to be disposed in the check position. Additionally, the reference electrode 65 which is attached onto the first drive unit 64 so as to be aligned with the substrate 61 is transferred with the substrate 61, and then the withstand voltage treatment and the check treatment for the treatment electrode may be performed. The reference electrode having substantially the same size as the treatment electrode is used; however, the state of the treatment electrode may be monitored by scanning a smaller electrode. Further, the treatment electrode 63 and the substrate 61 or the reference electrode 65 may be relatively transferred. For example, the treatment electrode 63 attached to other drive unit is transferred, and the withstand voltage treatment and the check treatment for the treatment electrode may be performed.

In this embodiment, although the check treatment for the treatment electrode is performed after the withstand voltage treatment, the check treatment may be performed before the withstand voltage treatment.

Further, in this embodiment, the treatment electrode with a smaller size than the target substrate is used; however, a treatment electrode with the same or larger size than the target substrate may be used.

A high-voltage device is assembled by using the substrate treated by the above substrate treating method. The high-voltage device is a device in which a potential difference of 1 kV or higher is generated between electrodes in the device. Specifically, there is an image display apparatus having an electron source, an anode for accelerating electrons emitted from the electron source, and a phosphor emitting light by irradiation of the accelerated electrons. The potential difference of 1 kV or higher is given between the electron source and the anode, whereby a favorable image can be displayed.

Substrate Treating Apparatus of Second Embodiment

A substrate treating apparatus of a second embodiment has abnormality detecting unit for detecting the abnormality in the substrate treatment (withstand voltage treatment). Other constitutions are substantially the same as the constitutions of the first embodiment. Hereinafter, an abnormality detecting method in the prior art substrate treating apparatus is first described as a comparative example, and thereafter, an abnormality detecting method in the present embodiment is described.

(Prior Art Abnormality Detecting Method)

Figure 5:
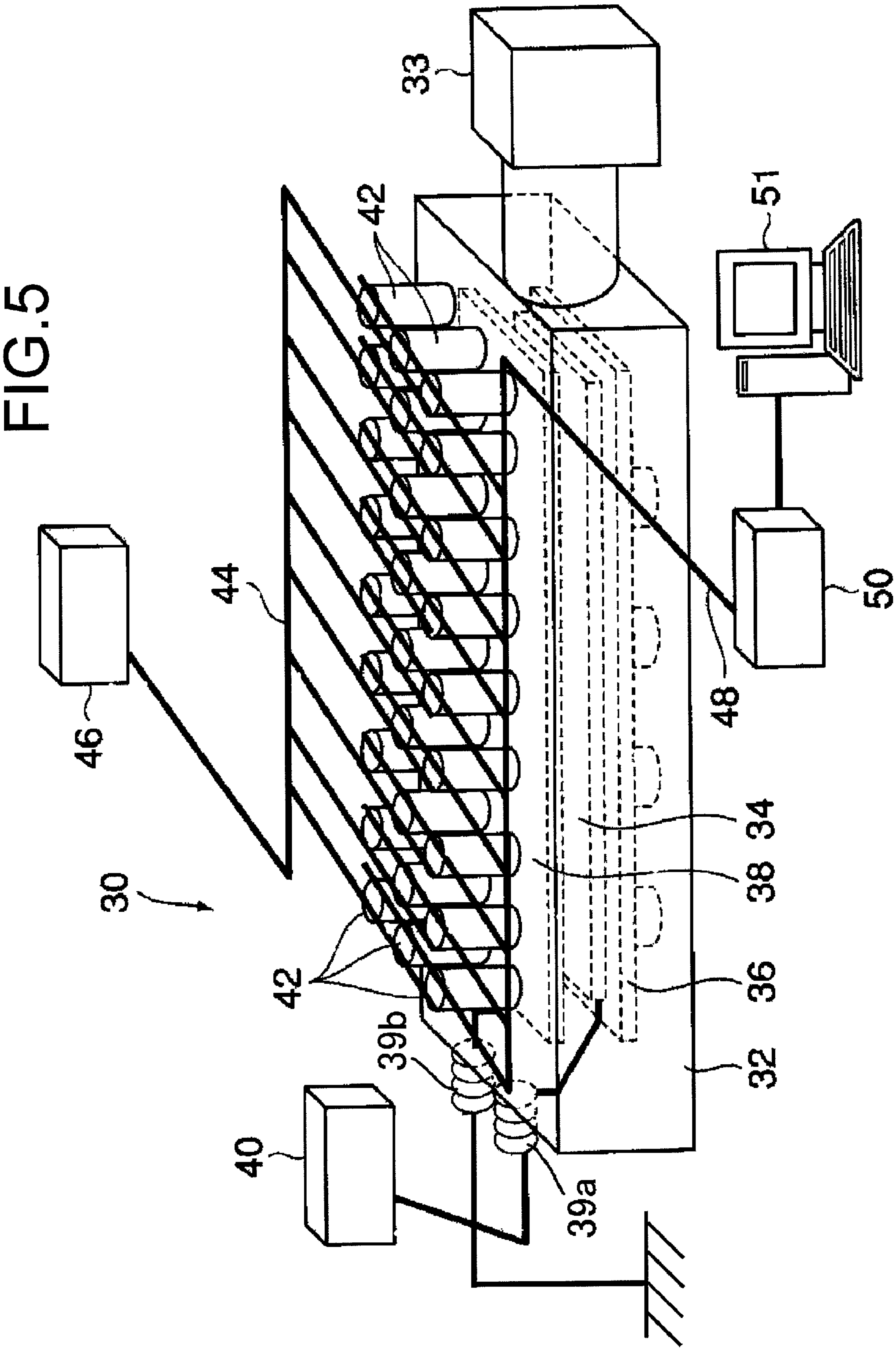
FIG. 5 is a view showing a constitution of a prior art substrate treating apparatus.

FIG. 5 shows a constitution of the prior art substrate treating apparatus.

As shown in FIG. 5, a substrate treating apparatus 30 has a vacuum chamber 32 operating as a vacuum treatment bath and an exhaust device 33 for evacuating inside the vacuum treatment bath. A rectangular plate-like substrate placement part 36 on which a substrate 34 to be treated or monitored is placed and a rectangular plate-like treatment electrode 38 disposed so as to be opposed to the substrate placement part at an interval are arranged in the vacuum treatment bath 32. The substrate placement part 36 and the treatment electrode 38 have a larger plane area than the substrate 34. The treatment electrode 38 is formed of, for example, a glass plate with ITO coated on the surface and is disposed so that the glass surface is directed toward the substrate 34. Further, the substrate treating apparatus 30 has a high-voltage supply 40 and is electrically connected to the substrate 34 via a feed-through 39*a* attached to the vacuum chamber 32, whereby a voltage is supplied to the substrate treating apparatus 30. Meanwhile, the treatment electrode 38 is electrically connected to a ground part via a feed-through 39*b* attached to the vacuum chamber 32, whereby it is in a ground state.

As shown in FIG. 5, a plurality of optical detectors 42 are arranged on the ceiling wall of the vacuum chamber 32 through a through-hole (not shown) and opposed to the treatment electrode 38. Namely, the optical detectors 42 are arranged at the opposite side of the substrate 34 with respect to the treatment electrode 38.

The intended light shielding treatment is applied to the entire vacuum treatment bath 32 in order to raise the sensitivity of the optical detector 42.

Each of the optical detectors 42 is connected to a power supply 46 through a power cable 44, and, at the same time, connected to a signal processing part 50 through a signal cable 48. The signal processing part 50 is connected to a personal computer 51 as a control part.

Next, a substrate treating method using the substrate treating apparatus is described.

The substrate 34 to be treated is placed on the substrate placement part 36, and thereafter, the vacuum treatment bath 32 is evacuated to a vacuum degree of about $10^{-5}$ Torr by the exhaust device 33 to be set in a vacuum atmosphere. In such a state, a voltage of not less than a panel rating is applied to between the substrate 34 and the treatment electrode 38 by a high-voltage supply 40, and the substrate 34 is subjected to conditioning. Namely, a voltage is applied to the substrate 34, whereby fine particles adhered onto the substrate 34 are peeled to be emitted, and, thus, to be captured by the treatment electrode 38.

When the fine particles are captured by the treatment electrode 38, the fine particles generate micro discharge by collision, or the fine particles excite a collision part on the surface of the treatment electrode 38, whereby the fine particles generate low light. Here, since the treatment electrode 38 is formed of ITO and glass through which light passes, the low light can be detected by the optical detector 42. The detected low light is converted into an electrical signal to be transmitted to the signal processing part 50. The signal processing part 50 distinguishes whether the size of the electrical signal converted from the low light is not less than a predetermined value (threshold value). When the size is not less than the threshold value, a trigger signal is generated to be transmitted to the personal computer 51. The personal computer 51 having received the trigger signal displays an image showing a light emission intensity and a light emitting point and generates an interlock signal or an alarm signal.

(Problems of Prior Art)

The prior art substrate treating apparatus has had the following problems. Namely, in the prior art, low light is detected, and therefore, stray light or light emission due to other than discharge remarkably reduces sensitivity (S/N). Thus, the vacuum chamber 32 should be shielded from light in order to prevent entering of light (stray light) from outside, and therefore, in general, an observation window provided for confirming the installation conditions of a substrate and electrodes cannot be used. Additionally, an ion gage for monitoring a vacuum state cannot be used because a detection line emits light. If a vacuum leak occurs in the withstand voltage treatment, large discharge occurs between a substrate and a treatment electrode, and therefore, the vacuum state should be monitored.

Further, when metastable light emission due to contact resistance occurs at a contact point between a contact for supplying a voltage to the target substrate and the target substrate, it is extremely difficult to distinguish discharge from the light emission.

Thus, there is a problem that it is very difficult to suppress the entering and generation of light caused by other than discharge, and the sensitivity required for monitoring of discharge cannot be ensured.

As other method of estimating a state of a substrate, there are some examples in the following documents. For example, in the first document "J. Phys. D: Appl. Phys., 10 (1977) p. 1693", the charge amount and the mass of particles passing through a metal mesh on the surface of a detector, called a drift detector, are calculated by the detector. In the second document "IEEE rans. Elec. Insul., 28 (1993) P. 481", charge movement of fine particles is detected by a device like a partial discharge measure.

In the above methods, the movement of the fine particles is detected as an electrical signal. However, since the minute amount of the electrical signal is output, the S/N is poor, whereby it is difficult to perform the detection with high accuracy. In addition, in these methods, the accidental movement of fine particles, that is, a pulsed electrical signal is detected, and thus, it is impossible to detect a field emission current like DC generated from undesired substances adhered onto the treatment electrode surface.

(Abnormality Detecting Method of Second Embodiment)

Figure 6:
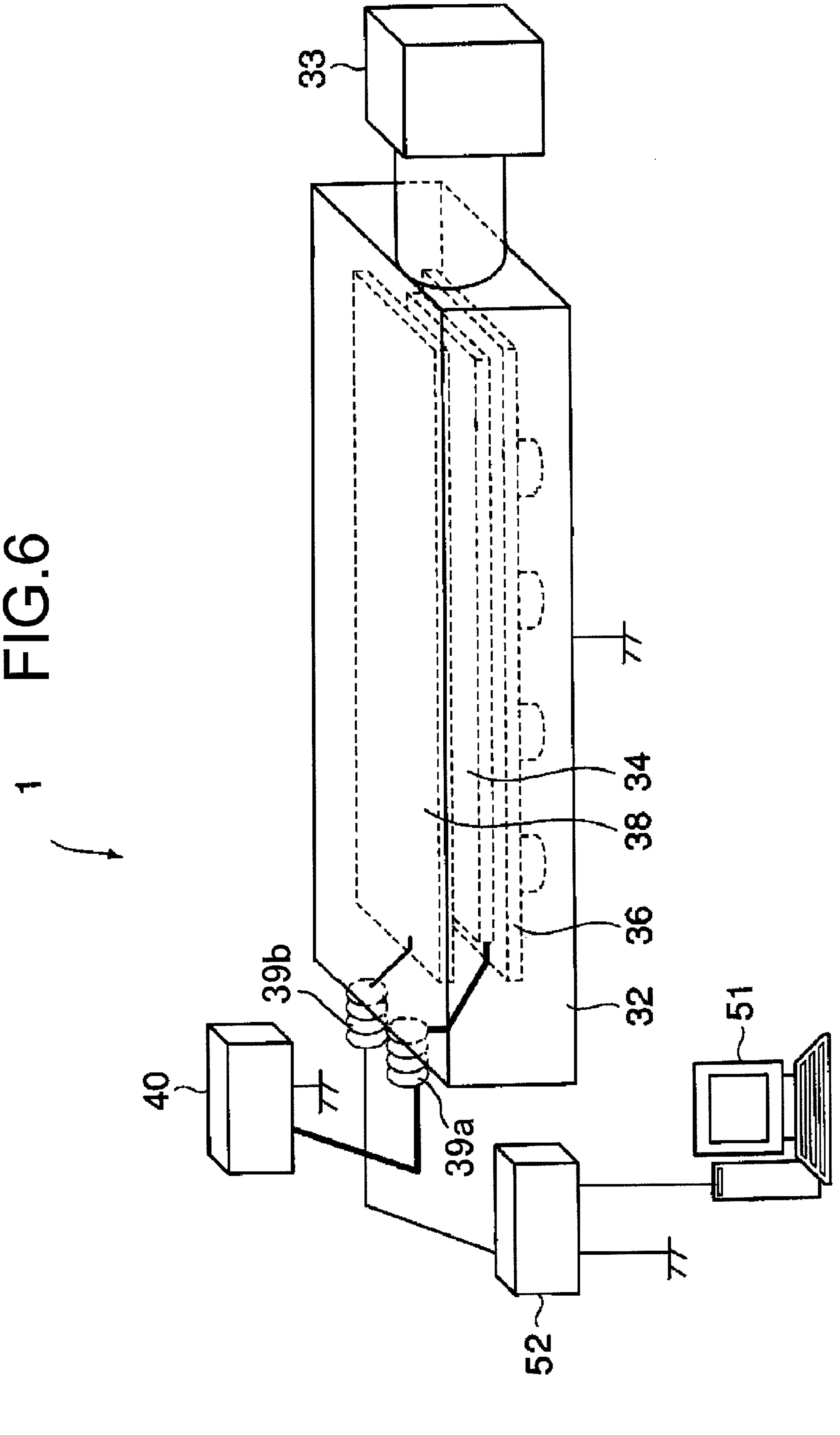
FIG. 6 is a view showing a structural example of a substrate treating apparatus according to a second embodiment.

FIG. 6 is a view showing a constitutional example of the substrate treating apparatus 1 according to the second embodiment of the present invention. The substrate treating apparatus 1 has the vacuum chamber 32 operating as a vacuum treatment bath and the exhaust device 33 for evacuating inside the vacuum chamber. The rectangular plate-like substrate placement part 36 on which the substrate 34 to be treated is placed and the rectangular plate-like treatment electrode 38 disposed so as to be opposed to the substrate placement part 36 at an interval are arranged in the vacuum chamber 32. The substrate placement part 36 and the treatment electrode 38 have a larger plane area than the substrate 34. The treatment electrode 38 is formed of, for example, a glass plate with ITO coated on the surface and disposed so that the glass surface is directed toward the substrate 34.

The substrate treating apparatus 1 further has the high-voltage supply 40. The high-voltage supply 40 is electrically connected to the substrate 34 via the feed-through 39*a* attached to the vacuum chamber 32, whereby a voltage is supplied from the high-voltage supply 40 to the substrate 34. Meanwhile, the treatment electrode 38 is electrically connected to the ground part via the feed-t through 39*b* attached to the vacuum chamber 32, whereby it is in a ground state.

In this embodiment, as shown in FIG. 6, a minute ammeter 52 (second ammeter) is inserted between the feed-through 39*b* and the ground part. The minute ammeter 52 can measure a minute electric current flowing from the treatment electrode 38 to the ground part (that is, an electric current flowing between the treatment electrode 38 and the substrate 34 in the withstand voltage treatment (in the substrate treatment)). As the minute ammeter 52, an ammeter having sensitivity with an electric current of 1 μA or lower can be preferably used. A data output terminal of the minute ammeter 52 is connected to the personal computer 51 for control and data processing through a signal line. In the present embodiment, the personal computer 51 and the minute ammeter 52 constitute an abnormality detecting unit for detecting the abnormality in the substrate treatment.

Next, a substrate treating method using the above substrate treating apparatus is described.

The substrate 34 to be treated is first placed on the substrate placement part 36. Thereafter, the vacuum chamber 32 is evacuated to a vacuum degree of about $10^{-5}$ Torr by the exhaust device 33 to be set to be a vacuum atmosphere. In such a state, a voltage of not less than a panel rating is applied between the substrate 34 and the treatment electrode 38 by the high-voltage supply 40, and the substrate 34 is subjected to conditioning. Namely, a voltage is applied to the substrate 34, whereby fine particles adhered onto the substrate 34 are peeled to be emitted from the substrate, and, thus, to be captured by the treatment electrode 38. According to this action, the substrate is subjected to conditioning (withstand voltage treatment) to remove a factor of discharge.

There are two main cases in which undesired substances are peeled from a substrate by voltage application: (1) undesired substances (normally, several 10 μm or lower) adhered onto a substrate by external factor, such as matters mixed in processes, are peeled; and (2) a part of a pattern (several 10 μm or higher) formed on a target substrate has a small adhesion and therefore to be peeled. In either case, the transfer from the substrate 34 to the treatment electrode 38 is performed in the state of having an electric charge induced by the electric field. Thus, a minute current flows according to this transfer; however, in the case (1), since the peeling of undesired substances does not reduce the function of the substrate, the minute current is not measured. Meanwhile, in the case (2), the function of the substrate is reduced, and, at the same time, the peeling from the peeling part is repeatedly continued, and therefore, even if the withstand voltage treatment is applied to the substrate, the withstand voltage cannot be guaranteed.

Figure 7A:
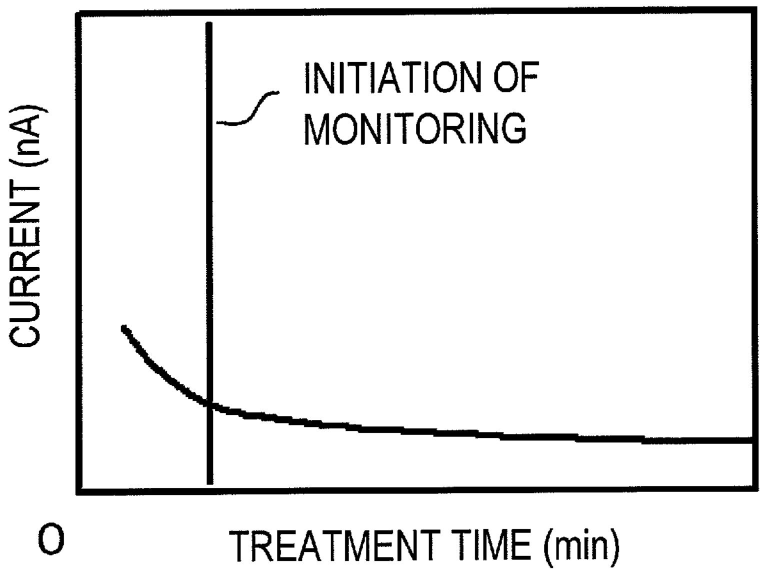
FIG. 7A is a view showing a current waveform in a case in which a withstand voltage treatment is normally performed.
Figure 7B:
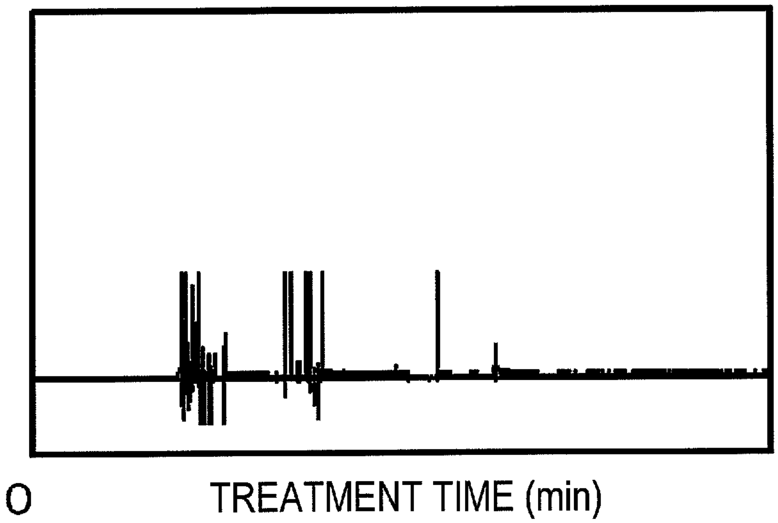
FIG. 7B is a view showing a current waveform observed when a part of a pattern on a substrate is peeled.
Figure 7C:
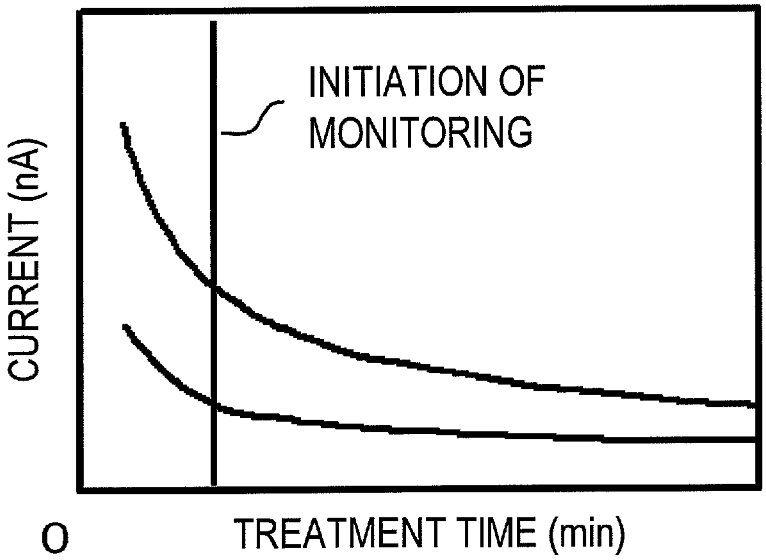
FIG. 7C is a view showing a current waveform observed when undesired substances are deposited onto a surface of a treatment electrode.

In the withstand voltage treatment, the time variation of the electric current output from the minute ammeter 52 is shown in FIGS. 7A to 7C. FIG. 7A is a current waveform in a case in which the withstand voltage treatment is normally performed. The start time of the withstand voltage treatment (initiation of voltage application) is set to be 0. An induced current flowing to a capacitance (C) between the substrate and the treatment electrode appears between several seconds and several 10 seconds after initiation of the voltage application, and the electric current of several 100 μA flows. A time constant CR constituted of the capacitance (C) and a resistance (R) on a circuit for applying a voltage attenuates the induced current. Thus, the substrate treatment will be monitored after a lapse of the time constant, that is, after a lapse of from several seconds to several 10 seconds.

When the substrate is normally treated, the size of the undesired substances peeled from the substrate is not more than about several 10 μm. The electric current associated with the transfer is not more than noise level (several nA), and therefore, the current value does not appear on a graph.

Meanwhile, a case in which a part of a pattern on a substrate is peeled is described by using FIG. 7B. In the graph of FIG. 7B, a time region after disappearance of the influence of the induced current in the time axis is enlarged and shown. When a part of the pattern is peeled, the size of the peeled undesired substances are large, and therefore, the amount of moving charge is increased in response to the increasing of the size of the undesired substances. In this case, as shown in FIG. 7B, the electric current of about several 10 nA to several μA appears in a burst manner.

The current value in such a withstand voltage treatment is displayed as a graph on a personal computer during the withstand voltage treatment. A processing for stopping the application of a high voltage on the basis of the detected current value is specifically performed as follows. Namely, when the current value exceeds a predetermined second threshold value, a voltage application stop signal is transmitted from the personal computer to the high-voltage supply, whereby the supply of high voltage from the high-voltage supply is stopped. When a state control panel (not shown) for controlling the supply of high voltage from the high-voltage supply is used, an interlock signal is transmitted from the personal computer to the state control panel to stop the supply of high voltage from the high-voltage supply. In addition, when the current value exceeds the predetermined second threshold value, a display showing an abnormality (alarm display) is output to the screen of the personal computer to thereby notify an operator of the occurrence of the abnormality. When a warning device such as a state indicator light is used, an alarm signal is transmitted from the personal computer to the warning device to give a warning. After the supply of high voltage is stopped, the substrate is removed.

The normal withstand voltage treatment may not be performed when undesired substances are deposited on the treatment electrode other than when the target substrate itself has a problem. Particularly when a large number of substrates are repeatedly treated, the number of undesired substances adhered onto the treatment electrode surface is increased, the field emission current is generated from the undesired substances. At this time, when the field emission current of several 10 nA or above is generated from one undesired substance, voltage drop in a glass becomes several kV or above, leading to the distortion (reduction) of the electric field at the position opposed to the undesired substance. Thus, the normal withstand voltage treatment cannot be performed in such a region.

A graph of an electric current measured by a minute ammeter at that time is shown in FIG. 7C. Namely, the electric current amount becomes larger than the normal state (the treatment electrode surface is clean) like DC.

The current value in such a withstand voltage treatment is displayed as a graph on a personal computer during the withstand voltage treatment. When the current value exceeds a predetermined threshold value, as with the above case, an interlock signal or an alarm signal is output from the personal computer. Then, the withstand voltage treatment for the substrate is immediately stopped, and then the substrate is removed. Further, the treatment electrode is replaced or cleaned.

As described above, in the second embodiment, the adhesion level of undesired substances onto the treatment electrode surface can be examined not only before and after the withstand voltage treatment, but also during the withstand voltage treatment. Therefore, the treatment electrode can be subjected to maintenance (replacement or surface cleaning) immediately after the occurrence of such a state, whereby it is possible to realize the improvement of the treatment efficiency and the improvement of the yield of products. Further, the defect in the target substrate is detected, whereby the treatment for the target substrate can be immediately stopped, and after the substrate as a defective is removed, the next substrate can be subjected to the withstand voltage treatment. According to this constitution, the improvement of treatment efficiency can be realized.

In this embodiment, a high voltage is applied to the substrate; however, a high voltage may be applied to the treatment electrode to electrically connect the substrate to the ground part. Also in such a case, a minute ammeter may be provided in an electrical circuit loop constituted of a high-voltage supply, a substrate, a treatment electrode, and a ground part.

In this embodiment, the electrode having a size larger than the size of the substrate is used as the treatment electrode. However, the treatment electrode having a size smaller than the target substrate may be used as with the first embodiment.

Further, in this embodiment, the minute ammeter may be provided at any position in a circuit loop. However, as described in the first embodiment, in view of simplification of the apparatus constitution and ensuring a safety, it is preferable that the ammeter is provided between the treatment electrode or the target substrate provided on the ground potential side and the ground part.

As described using the first and second embodiments, according to the substrate treating apparatus and the substrate treating method of the present invention, the adhesion and deposition of undesired substances onto the treatment electrode surface can be accurately detected. In addition, the treatment electrode can be subjected to maintenance (replacement or surface cleaning) immediately after the occurrence of such a state, whereby it is possible to realize the improvement of treatment efficiency and the improvement of yield of products. Thus, according to this invention, a substrate is efficiently subjected to the withstand voltage treatment, whereby the image display apparatus with high withstand voltage can be manufactured.

While the present invention has been described with reference to exemplary embodiments, it is to be understood that the invention is not limited to the disclosed exemplary embodiment. The scope of the following claims is to be accorded the broadest interpretation so as to encompass all such modifications and equivalent structures and functions.

This application claims the benefit of Japanese Patent Application No. 2007-332116, filed on Dec. 25, 2007, which is hereby incorporated by reference herein in its entirety.

What is claimed is:

1. A substrate treating method comprising:

a substrate treatment step of applying a voltage to between a treatment electrode and a target substrate in such a state that the treatment electrode is opposed to the target substrate and thereby removing an undesired substance on the target substrate;

a transfer step of transferring at least one of the treatment electrode and a reference electrode before or after the substrate treatment step and thereby providing the treatment electrode so as to be opposed to the reference electrode; and a check step of applying a voltage to between the treatment electrode and the reference electrode in such a state that the treatment electrode is opposed to the reference electrode and thereby checking an adhesion level of an undesired substance onto a surface of the treatment electrode.

2. A substrate treating method according to claim 1, wherein the substrate treatment step is performed in a vacuum chamber, and the reference electrode is an electrode provided in the vacuum chamber.

3. A method for manufacturing a high-voltage device, comprising:

a substrate treatment step of applying a voltage to between a treatment electrode and a substrate constituting the high-voltage device in such a state that the substrate is opposed to the treatment electrode and thereby removing an undesired substance on the substrate; and an assembly step of assembling the high-voltage device using the substrate after the substrate treatment step, wherein the treatment electrode used in the substrate treatment step is a treatment electrode in which a voltage is applied between the treatment electrode and a reference electrode in such a state that the treatment electrode is opposed to the reference electrode to thereby check an adhesion level of an undesired substance onto a surface of the treatment electrode.

* * * * *